United States Patent
Xi et al.

(10) Patent No.: US 8,766,382 B2
(45) Date of Patent: Jul. 1, 2014

(54) MRAM CELLS INCLUDING COUPLED FREE FERROMAGNETIC LAYERS FOR STABILIZATION

(75) Inventors: Haiwen Xi, San Jose, CA (US);
Kaizhong Gao, Eden Prairie, MN (US);
Dimitar V. Dimitrov, Edina, MN (US);
Song S. Xue, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 661 days.

(21) Appl. No.: 13/015,320

(22) Filed: Jan. 27, 2011

(65) Prior Publication Data

US 2011/0121418 A1    May 26, 2011

Related U.S. Application Data

(63) Continuation of application No. 12/248,257, filed on Oct. 9, 2008, now Pat. No. 7,880,209.

(51) Int. Cl.
*H01L 29/82* (2006.01)
*H01L 43/08* (2006.01)
*G11C 11/16* (2006.01)

(52) U.S. Cl.
CPC ............... *H01L 43/08* (2013.01); *G11C 11/16* (2013.01)
USPC .... 257/421; 365/158; 365/173; 257/E29.167; 257/E29.323; 438/3; 428/811.1; 428/811.2

(58) Field of Classification Search
CPC ................................ G11C 11/16; H01L 43/08
USPC ................ 438/3; 360/324.1, 324.11, 324.12, 360/324.2; 365/158, 173; 257/295, 421, 257/422, E29.167, E29.323; 428/811.1, 428/811.2
See application file for complete search history.

(56) References Cited

U.S. PATENT DOCUMENTS

| | | |
|---|---|---|
| 5,920,446 A | 7/1999 | Gill |
| 6,252,796 B1 | 6/2001 | Lenssen et al. |
| 6,381,106 B1 | 4/2002 | Pinarbasi |
| 6,469,926 B1 | 10/2002 | Chen |
| 6,531,723 B1 * | 3/2003 | Engel et al. ............ 257/200 |
| 6,532,164 B2 | 3/2003 | Redon et al. |
| 6,603,677 B2 | 8/2003 | Redon et al. |
| 6,633,498 B1 | 10/2003 | Engel et al. |
| 6,700,753 B2 | 3/2004 | Singleton et al. |
| 6,711,052 B2 * | 3/2004 | Subramanian et al. ....... 365/158 |
| 6,714,444 B2 | 3/2004 | Huai et al. |
| 6,744,086 B2 | 6/2004 | Daughton et al. |

(Continued)

OTHER PUBLICATIONS

Emley, N.C., et al., "Reduction of spin transfer by synthetic antiferromagnets," Applied Physics Letters, May 24, 2004, pp. 4257-4259, vol. 84, No. 21, US.

(Continued)

*Primary Examiner* — Mary Wilczewski
(74) *Attorney, Agent, or Firm* — Hall Estill Attorneys at Law

(57) ABSTRACT

A free ferromagnetic data storage layer of an MRAM cell is coupled to a free ferromagnetic stabilization layer, which stabilization layer is directly electrically coupled to a contact electrode, on one side, and is separated from the free ferromagnetic data storage layer, on an opposite side, by a spacer layer. The spacer layer provides for the coupling between the two free layers, which coupling is one of: a ferromagnetic coupling and an antiferromagnetic coupling.

21 Claims, 3 Drawing Sheets

(56) References Cited

U.S. PATENT DOCUMENTS

| | | | |
|---|---|---|---|
| 6,759,263 B2 | 7/2004 | Ying et al. | |
| 6,760,266 B2 * | 7/2004 | Garni et al. | 365/209 |
| 6,765,819 B1 | 7/2004 | Bhattacharyya et al. | |
| 6,801,415 B2 | 10/2004 | Slaughter et al. | |
| 6,818,961 B1 * | 11/2004 | Rizzo et al. | 257/422 |
| 6,829,161 B2 | 12/2004 | Huai et al. | |
| 6,831,312 B2 | 12/2004 | Slaughter et al. | |
| 6,835,423 B2 | 12/2004 | Chen et al. | |
| 6,838,740 B2 | 1/2005 | Huai et al. | |
| 6,842,368 B2 | 1/2005 | Hayakawa | |
| 6,847,547 B2 | 1/2005 | Albert et al. | |
| 6,850,433 B2 | 2/2005 | Sharma et al. | |
| 6,865,109 B2 * | 3/2005 | Covington | 365/173 |
| 6,888,703 B2 | 5/2005 | Dieny et al. | |
| 6,888,742 B1 | 5/2005 | Nguyen et al. | |
| 6,920,063 B2 | 7/2005 | Huai et al. | |
| 6,943,040 B2 | 9/2005 | Min et al. | |
| 6,958,927 B1 | 10/2005 | Nguyen et al. | |
| 6,967,366 B2 * | 11/2005 | Janesky et al. | 257/295 |
| 6,979,586 B2 | 12/2005 | Guo et al. | |
| 6,985,385 B2 | 1/2006 | Nguyen et al. | |
| 6,992,359 B2 | 1/2006 | Nguyen et al. | |
| 6,998,150 B2 * | 2/2006 | Li et al. | 427/130 |
| 7,009,877 B1 | 3/2006 | Huai et al. | |
| 7,019,949 B2 * | 3/2006 | Freitag et al. | 360/324.11 |
| 7,057,921 B2 | 6/2006 | Valet | |
| 7,067,330 B2 | 6/2006 | Min et al. | |
| 7,088,609 B2 | 8/2006 | Valet | |
| 7,098,495 B2 | 8/2006 | Sun et al. | |
| 7,099,186 B1 | 8/2006 | Braun | |
| 7,102,916 B2 * | 9/2006 | Trouilloud et al. | 365/158 |
| 7,105,372 B2 | 9/2006 | Min et al. | |
| 7,110,287 B2 | 9/2006 | Huai et al. | |
| 7,129,098 B2 * | 10/2006 | Rizzo et al. | 438/3 |
| 7,169,623 B2 * | 1/2007 | Ditizio | 438/3 |
| 7,184,300 B2 * | 2/2007 | Savtchenko et al. | 365/158 |
| 7,189,583 B2 * | 3/2007 | Drewes | 438/3 |
| 7,190,611 B2 | 3/2007 | Nguyen et al. | |
| 7,196,882 B2 * | 3/2007 | Deak | 360/324.2 |
| 7,233,039 B2 | 6/2007 | Huai et al. | |
| 7,242,045 B2 | 7/2007 | Nguyen et al. | |
| 7,285,836 B2 | 10/2007 | Ju et al. | |
| 7,379,280 B2 * | 5/2008 | Fukumoto et al. | 360/324.2 |
| 7,466,524 B2 * | 12/2008 | Freitag et al. | 360/324.11 |
| 7,477,491 B2 | 1/2009 | Li et al. | |
| 7,479,394 B2 * | 1/2009 | Horng et al. | 438/3 |
| 7,489,541 B2 | 2/2009 | Pakala et al. | |
| 7,495,867 B2 | 2/2009 | Sbiaa et al. | |
| 7,572,645 B2 * | 8/2009 | Sun et al. | 438/3 |
| 7,880,209 B2 * | 2/2011 | Xi et al. | 257/295 |
| 7,985,994 B2 * | 7/2011 | Zheng et al. | 257/295 |
| 8,179,716 B2 * | 5/2012 | Xi et al. | 365/158 |
| 8,203,871 B2 * | 6/2012 | Lou et al. | 365/158 |
| 8,289,756 B2 * | 10/2012 | Zheng et al. | 365/158 |
| 8,294,227 B2 * | 10/2012 | Zheng et al. | 257/421 |
| 8,362,534 B2 * | 1/2013 | Zheng et al. | 257/295 |
| 2004/0012994 A1 * | 1/2004 | Slaughter et al. | 365/158 |
| 2004/0017639 A1 * | 1/2004 | Deak | 360/290 |
| 2004/0170055 A1 | 9/2004 | Albert et al. | |
| 2004/0179311 A1 | 9/2004 | Li et al. | |
| 2004/0197579 A1 | 10/2004 | Chen et al. | |
| 2006/0061919 A1 | 3/2006 | Li et al. | |
| 2006/0093862 A1 * | 5/2006 | Parkin | 428/811.1 |
| 2007/0008661 A1 | 1/2007 | Min et al. | |
| 2007/0035890 A1 | 2/2007 | Sbiaa | |
| 2007/0195468 A1 * | 8/2007 | Freitag et al. | 360/324.11 |
| 2008/0113220 A1 * | 5/2008 | Sun et al. | 428/800 |
| 2008/0191251 A1 | 8/2008 | Ranjan et al. | |
| 2008/0205130 A1 * | 8/2008 | Sun et al. | 365/173 |
| 2010/0090300 A1 * | 4/2010 | Xi et al. | 257/421 |
| 2010/0176471 A1 | 7/2010 | Zhu et al. | |
| 2011/0121418 A1 * | 5/2011 | Xi et al. | 257/421 |

OTHER PUBLICATIONS

Hayakawa, J., et al., "Current-Induced Magnetization Switching in MgO Barrier Based Magnetic Tunnel Junction with CoFeB/Ru/CoFeB Synthetic Ferrimagnetic Free Layer," Japanese Journal of Applied Physics, 2006, pp. L1057-L1060, vol. 45, No. 40, The Japan Society of Applied Physics, Japan.

Miura, K., et al., "A novel SPRAM (SPin-transfer torque RAM) with a synthetic ferrimagnetic free layer for higher immunity to read disturbance and reducing write-current dispersion," Symposium on VLSI Technology Digest of Technical Papers, 2007, pp. 234-235, Japan.

Sun, J.Z., "Spin angular momentum transfer in current-perpendicular nanomagnetic junctions," IBM J. Res. & Ev., Jan. 1, 2006, pp. 81-100, vol. 50, No. 1.

Yen, C-T, et al., "Reduction in critical current density for spin torque transfer switching with composite free layer," Applied Physics Letters 93, 2008, pp. 1-3, American Institute of Physics.

* cited by examiner

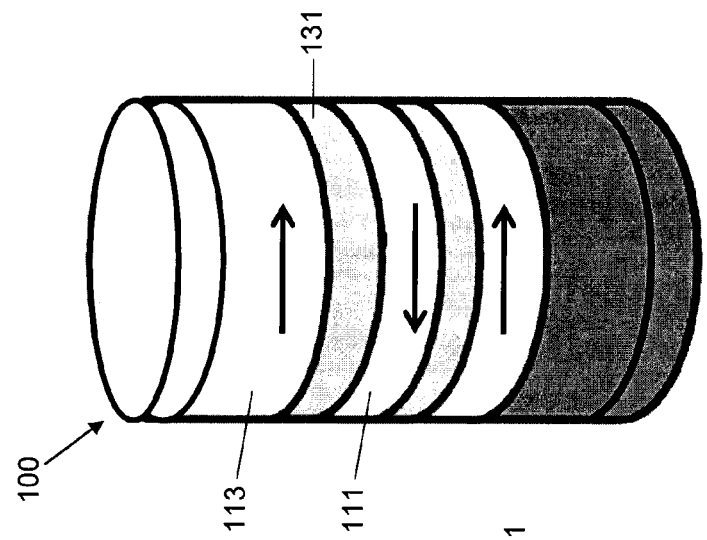
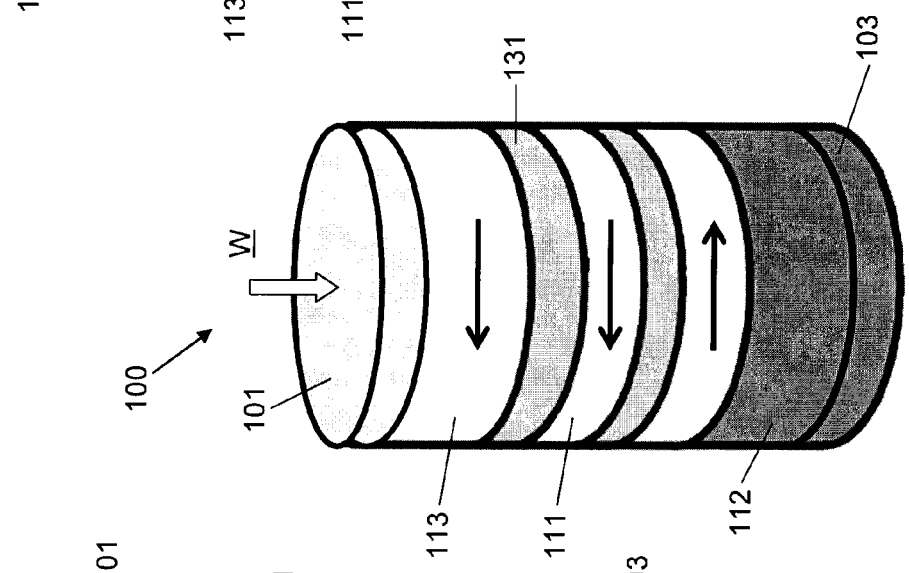
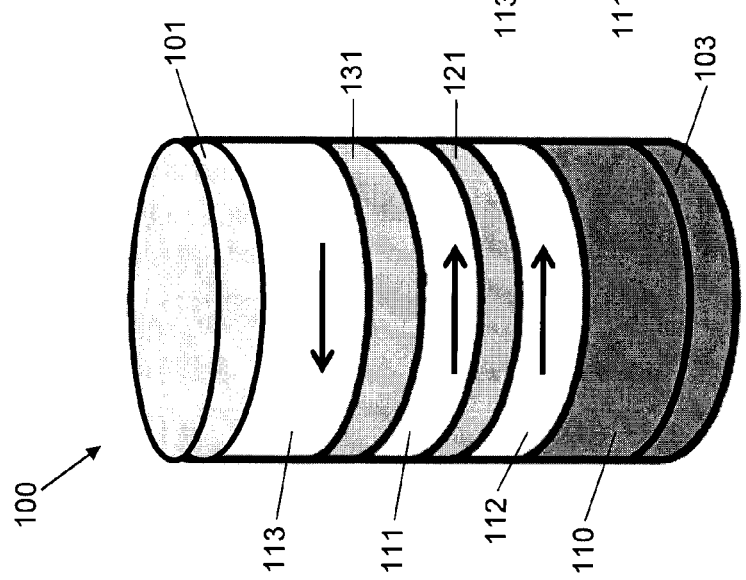

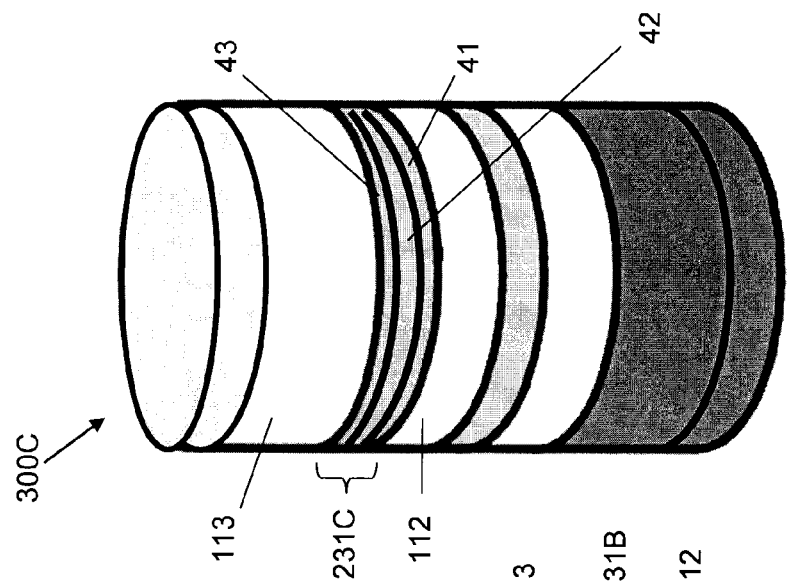
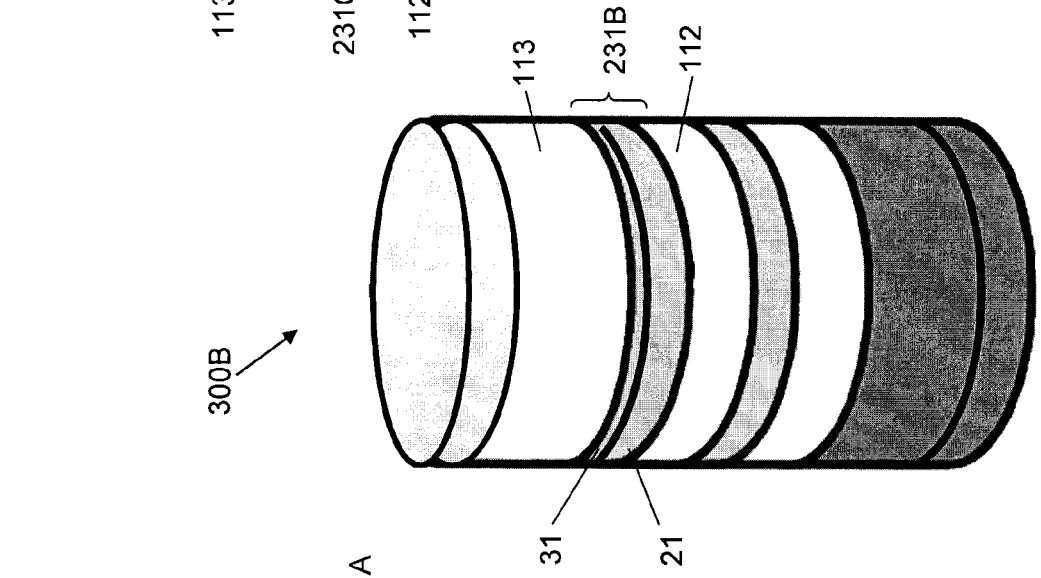
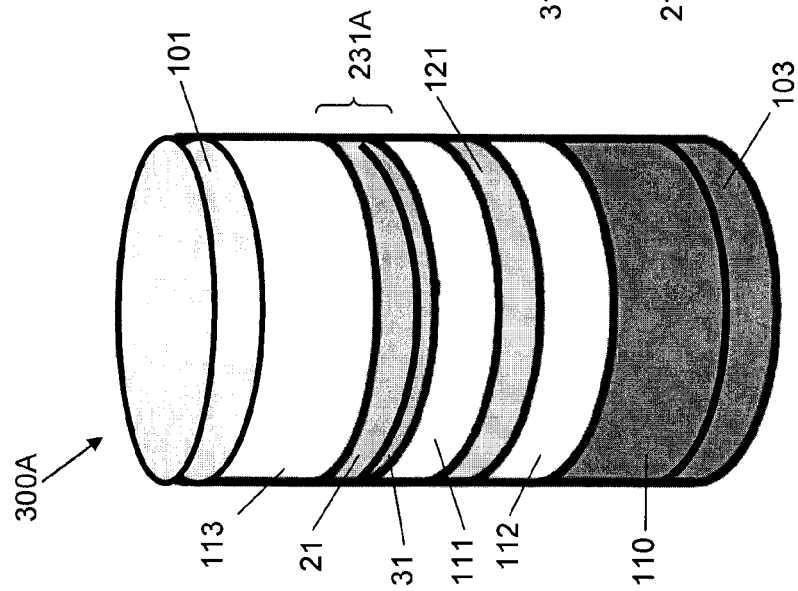

US 8,766,382 B2

MRAM CELLS INCLUDING COUPLED FREE FERROMAGNETIC LAYERS FOR STABILIZATION

RELATED APPLICATION

This application is a continuation of application Ser. No. 12/248,257 filed on Oct. 9, 2008, now issued as U.S. Pat. No. 7,880,209.

BACKGROUND

Magnetoresistive random access memory (MRAM) typically employs an array of magnetic storage elements, or cells, which are each located at, or near, an intersection, or crossing, of a corresponding word line with a corresponding bit line. Those skilled in the art know that spin transfer can be used as an alternative to, or in addition to, an external magnetic field in programming current perpendicular to plane (CPP) configurations MRAM cells, which may be either of the magnetic tunnel junction (MTJ) type or of the spin valve (SV) type. When a spin-polarized write current passes through a data storage layer of the cell, which is a free ferromagnetic layer, a portion of the spin angular momentum of the electrons incident on the data storage layer is transferred to the data storage layer. A spin transfer effect, that is caused by conduction electrons traveling from a pinned ferromagnetic layer of the cell to the data storage layer, switches the magnetization orientation of the data storage layer from a direction that is opposite to that of the magnetization orientation of the pinned layer, to a direction that coincides with that of the magnetization orientation of the pinned layer, for example, to program, or write, a logical "0" to the cell; and, a spin transfer effect that is caused by conduction electrons traveling in the opposite direction, switches the magnetization orientation of the data storage layer back to the direction that is opposite to that of the magnetization orientation of the pinned layer, for example, to write a logical "1" to the cell.

In some MRAM arrays, data storage layers may be susceptible to an inadvertent switching, for example, caused by thermally induced lattice vibration. This thermal instability of the storage layers may be due to a reduction in the size and/or magnetization thereof. Furthermore, a significant amount of Joule heating may be generated by a write current, and those cells, which are adjacent to one being written, particularly in ultra high density MRAM arrays, may be inadvertently switched due to the heating. Thus, there is a need for MRAM cell configurations that provide for enhanced thermal stability.

BRIEF SUMMARY

Various embodiments of the present disclosure are generally directed to an apparatus and method for storing data. In accordance with some embodiments, an apparatus comprises a free ferromagnetic data storage layer having a first thickness, a free ferromagnetic stabilization layer having a second thickness greater than the first thickness, and a multi-layered coupling layer disposed between and adapted to ferromagnetically couple the data storage layer and the stabilization layer.

BRIEF DESCRIPTION OF THE DRAWINGS

The following drawings are illustrative of particular embodiments of the disclosure and therefore do not limit the scope. The drawings are not to scale (unless so stated) and are intended for use in conjunction with the explanations in the following detailed description. Embodiments of the disclosure will hereinafter be described in conjunction with the appended drawings, wherein like numerals denote like elements.

FIGS. 2A-C are schematics showing a sequence of events associated with the application of a write current to the cell of FIG. 1.

FIGS. 3A-C are schematics showing various configurations of an MRAM cell, according to alternate embodiments.

DETAILED DESCRIPTION

Figure 1:
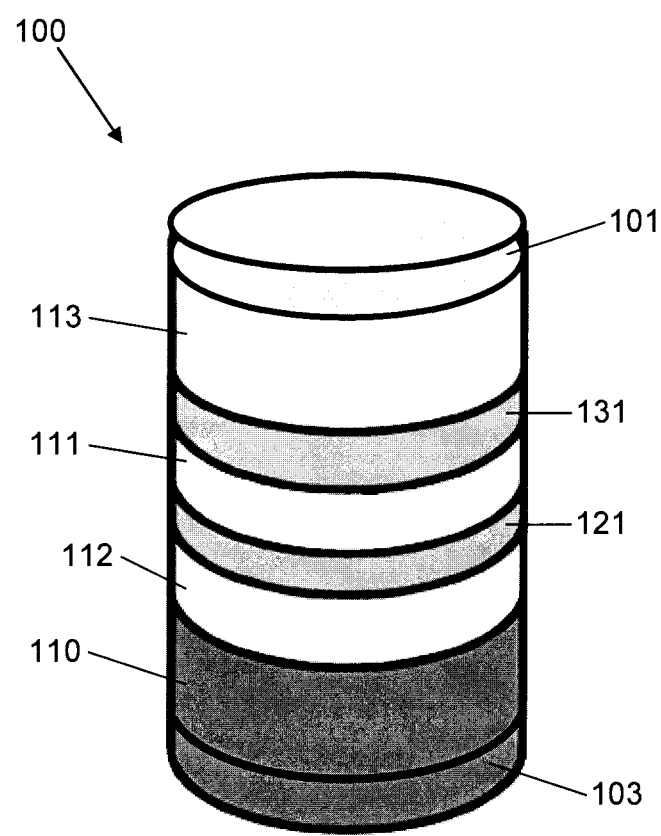
FIG. 1 is a schematic showing a basic configuration of an MRAM cell, according to some embodiments.

The following detailed description is exemplary in nature and is not intended to limit the scope, applicability, or configuration in any way. Rather, the following description provides practical illustrations for implementing exemplary embodiments.

FIG. 1 is a schematic showing a basic configuration of an MRAM cell 100, according to some embodiments. FIG. 1 illustrates cell 100 including a pinned layer 112, a free ferromagnetic data storage layer 111, a first spacer layer 121, which extends between data storage layer 111 and pinned layer 112, a free ferromagnetic stabilization layer 113, which is directly electrically coupled to a first electrode contact layer 101, and a second spacer layer 131, which extends alongside stabilization layer 113, opposite first electrode contact layer 101, and between stabilization layer 113 and data storage layer 111. First spacer layer 121 is nonmagnetic and may be either conductive, for example, formed from metallic materials, such as Au, Ag, and Cu, or insulative, for example, formed from oxide and semiconductor barriers, such as AlO, TiO and MgO. FIG. 1 further illustrates pinned layer 112 of cell 100, which may either be a single layer or a synthetic antiferromagnetic coupled structure (SAF), being pinned by an adjacent antiferromagnetic pinning layer 110, which is directly electrically coupled to a second electrode contact layer 103. Those skilled in the art will appreciate that, although not shown, cell 100 is electrically coupled, via electrode contacts 101 and 103, to an intersection of a corresponding word line and bit line of an MRAM array, which may include on the order of 1,000, or more, intersecting word and bit lines and corresponding MRAM cells.

According to embodiments of the present disclosure, second spacer layer 131 is conductive and provides either ferromagnetic coupling or antiferromagnetic coupling between data storage layer 111 and stabilization layer 113, wherein a strength of the coupling is greater than a coercivity of the stabilization layer 113; when a magnetization orientation of data storage layer 111 is switched, or re-programmed, the magnetization orientation of stabilization layer 113 will follow, as will be further described in conjunction with FIG. 2C. The coupling between free layers 111, 113, whether ferromagnetic or antiferromagnetic, stabilizes cell 100 against, for example, inadvertent heat-induced switching. Free layers 111, 113 may be formed from transition metals, such as Ni, Co and Fe, alloys thereof, for example, NiFe and CoFe, or ternary alloys, such as CoFeB. According to an exemplary embodiment, stabilization layer 113 has a coercivity in a range from approximately 50 Oe to approximately 200 Oe, and is approximately 4 nm thick, and data storage layer 111 is approximately 3 nm thick. A thickness of second spacer layer 131 may be between approximately 2 nm and approximately 20 nm, and second spacer layer 131 may further provide for spin depolarization. Second spacer layer 131 may be formed from a conductive and antiferromagnetic material, such as FeMn, RhMn, FeRhMn, IrMn, PtMn, PdMn, PtPdMn, NiMn, CrMn or CrPtMn, or from a conductive and paramagnetic material, for example, formed by doping nonmagnetic metals, or alloys, such as Al, Cu, Ag and Pt, with magnetic atoms of, for example, Fe, Co, Ni, Cr or Mn. According to yet further embodiments, second spacer layer 131 is formed from a conductive and non-magnetic material, such as Al, Cu, Pt, Ag or Ru.

FIGS. 2A-C are schematics showing a sequence of events associated with the application of a write current to cell 100. FIG. 2A illustrates cell 100 in which data storage layer 111 has been programmed such that the magnetization orientation thereof is aligned with that of pinned layer 112. FIG. 2A further illustrates second spacer layer 131 providing for anti-ferromagnetic coupling between stabilization layer 113 and data storage layer 111, in order to stabilize the magnetization orientation of layer 111, until a write current is applied to cell 100 in order to re-program cell 100. FIG. 2B schematically illustrates the applied write current with an arrow W. As previously described, cell 100, is electrically coupled, via contacts 101 and 103, between a word line and bit line of an MRAM array such that a voltage potential, between the lines, drives write current W. FIG. 2B further illustrates, data storage layer 111 having been switched, or reprogrammed, to an opposite magnetization orientation, via a spin transfer effect of write current W. Once the magnetization orientation of layer 111 has been reversed, antiferromagnetic coupling between layer 111 and stabilization layer 113, will cause the magnetization orientation of layer 113 to reverse, as illustrated in FIG. 2C. In FIG. 2C, cell 100 is re-programmed and stabilized by the antiferromagnetic coupling between free layers 111 and 113.

The antiferromagnetic coupling between layers 111 and 113, which is illustrated by FIGS. 2A-C, may be achieved by magnetostatic coupling. Magnetostatic coupling, that has a significant coupling strength, can exist across second spacer layer 131, which has a thickness of over approximately 20 nm, and may be independent of a material that forms spacer layer 131. Alternately, ferromagnetic coupling may be achieved by Neel coupling (a.k.a. orange-peel coupling), which arises from interface roughness, or via RKKY interaction. RKKY coupling is oscillatory and can be either ferromagnetic or antiferromagnetic, depending upon a thickness of second spacer layer 131. The oscillation period is typically about 0.5 nm and also depends upon the materials from which spacer layer 131, and free layers 111, 113 are formed. By carefully choosing the spacer thickness and material, and by engineering the interface roughness to cancel out the magnetostatic coupling, a net ferromagnetic coupling can be achieved. A thickness of second spacer layer 131 that provides for ferromagnetic coupling may be less than approximately 10 nm.

FIGS. 3A-C are schematics showing various configurations of an MRAM cell 300A, 300B and 300C, respectively, according to alternate embodiments. Each of cells 300A-C is similar to cell 100 in that each includes electrode contact layers 101, 103, pinned layer 112, which is pinned by layer 110, first spacer layer 121, which separates pinned layer 112 from free ferromagnetic data storage layer 111, and free ferromagnetic stabilization layer 113. In contrast to cell 100, each of cells 300A-C includes a multi-layer conductive spacer layer 231A, 231B and 231C, respectively.

FIG. 3A illustrates conductive spacer layer 231A of cell 300A including a first sub-layer 21 and a second sub-layer 31, wherein second sub-layer 31 is directly adjacent data storage layer 111 and has a thickness that is less than that of first sub-layer 21. FIG. 3B illustrates conductive spacer layer 231B of cell 300B also including first and second sub-layers 21, 31, except that the arrangement thereof is reversed from that for cell 300A. According to some embodiments, first sub-layer 21 is non-magnetic and may have a thickness of approximately 4 nm, and second sub-layer 31 may either be antiferromagnetic or paramagnetic, and may have a thickness of approximately 2 nm. According to those embodiments in which second sub-layer 31 is paramagnetic, second sub-layer 31 may be formed by doping first sub-layer 21 with a magnetic material. FIG. 3C illustrates conductive spacer layer 231C of cell 300C including a first sub-layer 41, a second sub-layer 42 and a third sub-layer 43; first sub-layer 41 is directly adjacent data storage layer 111, second sub-layer 42 extends between first and third sub-layers 41, 43, and third sub-layer 43 is directly adjacent stabilization layer 113. FIG. 3C further illustrates first and third sub-layers 41, 43 having a thickness that is less than that of second sub-layer 42. According to some embodiments, second sub-layer 42 is non-magnetic and may have a thickness of approximately 4 nm, and first and third sub-layers 41, 43 are each either antiferromagnetic or paramagnetic and may each have a thickness of approximately 2 nm. According to some additional embodiments, first and third sub-layers 41, 43 are each non-magnetic and second sub-layer may be either antiferromagnetic or paramagnetic. Multi-layer conductive spacer layers 231A, 231B, 231C may be particularly suited to depolarize conduction electron spin orientation in order to prevent spin transfer in free ferromagnetic stabilization layer 113. It should be noted that material matching at the interfaces of the sub-layers for these multi-layer spacer layer embodiments is important to prevent interlayer mixing of atoms, due to thermal diffusion. Furthermore, the thicknesses of the sub-layers should be adjusted to achieve the desired magnetic coupling strength, spin-depolarization efficiency and diffusion-blocking ability. Examples of some suitable antiferromagnetic materials, which may be incorporated by multi-layer conductive spacer layers 231A, 231B, 231C, include, without limitation, FeMn, RhMn, FeRhMn, IrMn, PtMn, PdMn, NiMn, CrMn and CrPtMn. Examples of some suitable conductive non-magnetic materials for spacer layers 231A, 231B, 231C include, without limitation, Al, Cu, Pt, Ag, Au, Ru and alloys thereof; and these non-magnetic materials may be doped with magnetic atoms such as Fe, Co, Ni, Cr or Mn, to form suitable paramagnetic materials for layers 231A, 231B, 231C.

In the foregoing detailed description, embodiments of the disclosure have been described. These implementations, as well as others, are within the scope of the appended claims.

We claim:

1. A memory element semiconductor stack comprising:
   a free ferromagnetic data storage layer having a first thickness;
   a free ferromagnetic stabilization layer having a second thickness greater than the first thickness; and
   a multi-layered coupling layer disposed between and adapted to ferromagnetically couple the data storage layer and the stabilization layer.

2. The semiconductor stack of claim 1, in which an overall strength of the ferromagnetic coupling between the data storage layer and the stabilization layer is greater than an overall coercivity of the stabilization layer.

3. The semiconductor stack of claim 1, in which the multi-layered coupling layer has at least one non-magnetic layer and at least one magnetic layer.

4. The semiconductor stack of claim 1, further comprising a pinned layer having a fixed magnetic orientation, and a spacer layer disposed between the pinned layer and the data storage layer, the stack storing a first data state responsive to the free layer having a magnetic orientation that coincides with the fixed magnetic orientation of the pinned layer, the stack storing a second data state responsive to the free layer having a magnetic orientation opposite the fixed magnetic orientation of the pinned layer.

5. The semiconductor stack of claim 1, in which the free ferromagnetic stabilization layer is formed from a transition metal.

6. The semiconductor stack of claim 1, in which the multi-layered coupling layer ferromagnetically couples the data storage layer and stabilization layer in an anti-parallel magnetic relationship.

7. The semiconductor stack of claim 1, in which the multi-layered coupling layer comprises a first sub-layer and a second sub-layer, the second sub-layer contactingly engaging the data storage layer and having a thickness less than that of the first sub-layer.

8. The semiconductor stack of claim 1, in which the multi-layered coupling layer comprises a first sub-layer and a second sub-layer, the first sub-layer contactingly engaging the data storage layer and having a thickness greater than that of the second sub-layer.

9. The semiconductor stack of claim 1, in which the multi-layered coupling layer comprises respective first, second and third sub-layers, the second layer disposed between and having a greater thickness than the first and third sub-layers.

10. The semiconductor stack of claim 1, in which the multi-layered coupling layer comprises a first sub-layer which contactingly engages the data storage layer and a second sub-layer which contactingly engages the stabilization layer, a selected one of the first or second sub-layers formed of a non-magnetic material and a remaining one of the first or second sub-layers formed of a magnetic material.

11. The semiconductor stack of claim 1, further comprising a conductive electrode contactingly engaging a top surface of the stabilization layer, and a conductive control line connected to the conductive electrode.

12. A data storage device comprising a cross-point array of memory cells arranged into rows and columns and interconnected via respective bit and word lines, each of the memory cells comprising a free ferromagnetic data storage layer having a first thickness, a free ferromagnetic stabilization layer having a second thickness, the second thickness being greater than the first thickness, and a multi-layered coupling layer disposed between and adapted to ferromagnetically couple the data storage layer and the stabilization layer.

13. The data storage device of claim 12, in which an overall strength of the ferromagnetic coupling between the data storage layer and the stabilization layer is greater than an overall coercivity of the stabilization layer.

14. The data storage device of claim 12, in which the multi-layered coupling layer has at least one non-magnetic layer and at least one magnetic layer.

15. The data storage device of claim 12, in which each of the memory cells further comprises a pinned layer having a fixed magnetic orientation, and a spacer layer disposed between the pinned layer and the data storage layer, the cell storing a first data state responsive to the free layer having a magnetic orientation that coincides with the fixed magnetic orientation of the pinned layer, the cell storing a second data state responsive to the free layer having a magnetic orientation opposite the fixed magnetic orientation of the pinned layer.

16. A method of forming a memory cell, comprising:
    forming a free ferromagnetic data storage layer having a first thickness;
    forming a multi-layered coupling layer on the data storage layer; and
    forming a free ferromagnetic stabilization layer on the coupling layer having a second thickness greater than the first thickness, the coupling layer adapted to ferromagnetically couple the data storage layer and the stabilization layer.

17. The method of claim 16, in which the coupling layer comprises a first sub-layer of non-magnetic material and a second sub-layer of magnetic material.

18. The method of claim 17, in which the first and second second sub-layers are formed by depositing a layer of non-magnetic material with a selected overall thickness nominally corresponding to a combined thickness of the first and second sub-layers, and doping a portion of said deposited layer with a magnetic material.

19. The method of claim 14, further comprising forming a conductive top electrode on the stabilization layer.

20. The method of claim 14, further comprising prior steps of forming a pinning layer on a lower electrode layer, forming a pinned layer on the pinning layer, and forming a spacer layer on the pinned layer, wherein the data storage layer is subsequently formed on the spacer layer.

21. The semiconductor stack of claim 1, in which the free ferromagnetic data storage layer is formed from a transition metal.

* * * * *

UNITED STATES PATENT AND TRADEMARK OFFICE
CERTIFICATE OF CORRECTION

PATENT NO. : 8,766,382 B2  
APPLICATION NO. : 13/015320  
DATED : July 1, 2014  
INVENTOR(S) : Haiwen Xi et al.

Page 1 of 1

It is certified that error appears in the above-identified patent and that said Letters Patent is hereby corrected as shown below:

In the Specification

In Col. 6, Line 32
delete "second"

In Col. 6, Line 37
replace "14"
with "16"

In Col. 6, Line 39
replace "14"
with "16"

Signed and Sealed this
Twenty-eighth Day of July, 2015

Michelle K. Lee
*Director of the United States Patent and Trademark Office*